United States Patent
Yoon et al.

(10) Patent No.: US 11,218,154 B2
(45) Date of Patent: Jan. 4, 2022

(54) INTEGRATED CIRCUIT, METHOD, AND ELECTRONIC DEVICE FOR REDUCING EMI OF SIGNAL

(71) Applicant: SAMSUNG ELECTRONICS CO., LTD., Suwon-si (KR)

(72) Inventors: Seungjoon Yoon, Suwon-si (KR); Cheolho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/964,369

(22) PCT Filed: Jan. 31, 2019

(86) PCT No.: PCT/KR2019/001325
§ 371 (c)(1),
(2) Date: Jul. 23, 2020

(87) PCT Pub. No.: WO2019/156422
PCT Pub. Date: Aug. 15, 2019

(65) Prior Publication Data
US 2021/0036709 A1    Feb. 4, 2021

(30) Foreign Application Priority Data
Feb. 6, 2018 (KR) ........................ 10-2018-0014760

(51) Int. Cl.
*H03L 7/187* (2006.01)
*G06F 1/08* (2006.01)
(Continued)

(52) U.S. Cl.
CPC ................ *H03L 7/187* (2013.01); *G06F 1/08* (2013.01); *G06F 1/10* (2013.01); *H03L 7/085* (2013.01)

(58) Field of Classification Search
CPC . H03L 7/187; H03L 7/18; H03L 7/085; H03L 7/099; G06F 1/08; G06F 1/10
(Continued)

(56) References Cited

U.S. PATENT DOCUMENTS 6,597,226 B1    7/2003    Eade et al.
7,337,335 B2    2/2008    Jorgenson et al.
(Continued)

FOREIGN PATENT DOCUMENTS

JP    2006-211479    8/2006
JP    2014-107324    6/2014
(Continued)

OTHER PUBLICATIONS

International Search Report for PCT/KR2019/001325 dated Apr. 25, 2019, 5 pages.
(Continued)

*Primary Examiner* — Hai L Nguyen
(74) *Attorney, Agent, or Firm* — Nixon & Vanderhye, P.C.

(57) ABSTRACT

An integrated circuit according to an embodiment of the disclosure may include a plurality of function blocks, a spread spectrum clock (SSC) generator that generates a spread spectrum clock based on a frequency modulation rate value, a clock distribution circuit that distributes the generated spread spectrum clock into the plurality of function blocks, a memory that stores predetermined frequency modulation rate values respectively corresponding to the plurality of function blocks, and a control circuit, and the control circuit may be configured to generate the spread spectrum clock based on a smaller frequency modulation rate value among a first frequency modulation rate value and a second frequency modulation rate value respectively corresponding to a first function block and a second function (Continued)

block, which are operating, from among the plurality of function blocks. Moreover, various embodiment found through the present disclosure are possible.

15 Claims, 9 Drawing Sheets

(51) Int. Cl.
*G06F 1/10* (2006.01)
*H03L 7/085* (2006.01)

(58) Field of Classification Search
USPC .......................................... 375/376
See application file for complete search history.

(56) References Cited

U.S. PATENT DOCUMENTS

| | | | |
|---|---|---|---|
| 7,446,578 B2 * | 11/2008 | Huang | H03L 7/099 327/147 |
| 7,657,764 B2 | 2/2010 | Jorgenson et al. | |
| 8,269,565 B2 | 9/2012 | Kim et al. | |
| 8,433,024 B2 * | 4/2013 | Chiang | H04B 14/06 375/375 |
| 8,588,275 B2 * | 11/2013 | Gelhausen | H03L 7/18 375/146 |
| 8,593,228 B2 | 11/2013 | Kim et al. | |
| 9,660,657 B2 | 5/2017 | Adachi | |
| 2006/0072648 A1 | 4/2006 | Kim et al. | |
| 2017/0093407 A1 | 3/2017 | Kim et al. | |
| 2017/0093604 A1 | 3/2017 | Dan | |
| 2017/0222652 A1 | 8/2017 | Adachi | |
| 2019/0199357 A1 | 6/2019 | Kim et al. | |

FOREIGN PATENT DOCUMENTS

| | | |
|---|---|---|
| KR | 10-2006-0030365 | 4/2006 |
| KR | 10-2007-0105316 | 10/2007 |
| KR | 10-2010-0137071 | 12/2010 |
| KR | 10-2011-0083140 | 7/2011 |
| WO | 2017/107901 | 6/2017 |

OTHER PUBLICATIONS

Written Opinion of the ISA for PCT/KR2019/001325 dated Apr. 25, 2019, 7 pages.

* cited by examiner

INTEGRATED CIRCUIT, METHOD, AND ELECTRONIC DEVICE FOR REDUCING EMI OF SIGNAL

This application is the U.S. national phase of International Application No. PCT/KR2019/001325 filed Jan. 31, 2019 which designated the U.S. and claims priority to KR Patent Application No. 10-2018-0014760 filed Feb. 6, 2018, the entire contents of each of which are hereby incorporated by reference.

FIELD

Embodiments of the disclosure relate to a technology for reducing an EMI of a signal.

DESCRIPTION OF RELATED ART

A spread spectrum technology for changing a frequency of a clock may be used to reduce the EMI generated at an electronic device. A spread spectrum clock is a clock having a spectrum that is spread by intentionally applying, at the electronic device, a random jitter to an existing clock signal for the purpose of reducing the EMI.

As the electronic device generates the spread spectrum clock, a high-frequency component that has an influence on the EMI decreases, and the remaining components of a high frequency are used. As such, it is possible to efficiently reduce the EMI.

SUMMARY

In general, a clock distribution network is implemented within an AP by grouping function blocks providing similar functions. In an example, in a function block for high-speed communication such as a universal serial bus (USB) or a peripheral component interconnect express (PCIe) communicating at a giga bit rate, because a reference clock in the function block reaches hundreds MHz, the function block may constitute one clock distribution network with a secure digital (SD) block or an embedded multimedia card (eMMC) block.

Modulation rates of a spread spectrum clock capable of being supplied to blocks constituting one network may be different from each other. For example, a modulation rate of the spread spectrum clock capable of being supplied to the SD block may be about 2%, a modulation rate of the spread spectrum clock capable of being supplied to the eMMC block may be about 0.5%, and a modulation rate of the spread spectrum clock capable of being supplied to the USB block may be about 0.2%. In the above example, a minimum value of modulation rate values respectively corresponding to the blocks has to be selected to maintain stability of each block. In this case, there is a problem in that it is impossible to reduce an EMI occurring at the SD block.

Various embodiments of the disclosure may supply a spread spectrum clock by dynamically changing a modulation rate when function blocks in which modulation rates of a spread spectrum clock to be supplied are different are connected with one clock distribution network.

An integrated circuit according to an embodiment of the disclosure may include a plurality of function blocks, a spread spectrum clock (SSC) generator that generates a spread spectrum clock based on a frequency modulation rate value, a clock distribution circuit that distributes the generated spread spectrum clock into the plurality of function blocks, a memory that stores predetermined frequency modulation rate values respectively corresponding to the plurality of function blocks, and a control circuit, and the control circuit may be configured to generate the spread spectrum clock based on a smaller frequency modulation rate value among a first frequency modulation rate value and a second frequency modulation rate value respectively corresponding to a first function block and a second function block, which are operating, from among the plurality of function blocks.

Also, an EMI reducing method of an integrated circuit according to an embodiment of the disclosure may include monitoring operation states of a plurality of function blocks included in the integrated circuit, generating a spread spectrum clock based at least on a smaller frequency modulation rate value among a first frequency modulation rate value and a second frequency modulation rate value respectively corresponding to a first function block and a second function block, which are operating, from among the plurality of function blocks, and distributing the generated spread spectrum clock into the first function block and the second function block operating.

Also, an electronic device according to an embodiment of the disclosure may include an AP, and a plurality of hardware modules that are controlled by the AP. The AP may include a plurality of function blocks that are functionally connected with the plurality of hardware modules, an SSC generator that generates a spread spectrum clock based on a frequency modulation value, a clock distribution circuit that distributes the generated spread spectrum clock to the plurality of function blocks, a memory that stores predetermined frequency modulation values respectively corresponding to the plurality of function blocks, and a control circuit, and the control circuit may be configured to control the SSC generator so as to generate the spread spectrum clock, based on a smaller frequency modulation rate value of a first frequency modulation rate value and a second frequency modulation rate value respectively corresponding to a first function block and a second function block, which are operating, from among the plurality of function blocks.

According to embodiments of the disclosure, the improvement of stability of a block and a decrease in EMI may be accomplished by dynamically changing a frequency modulation rate value of a spread spectrum clock based on operation states of function blocks.

Besides, a variety of effects directly or indirectly understood through this disclosure may be provided.

With regard to description of drawings, the same or similar components will be marked by the same or similar reference signs.

DETAILED DESCRIPTION OF EXAMPLE EMBODIMENTS

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

Figure 1:
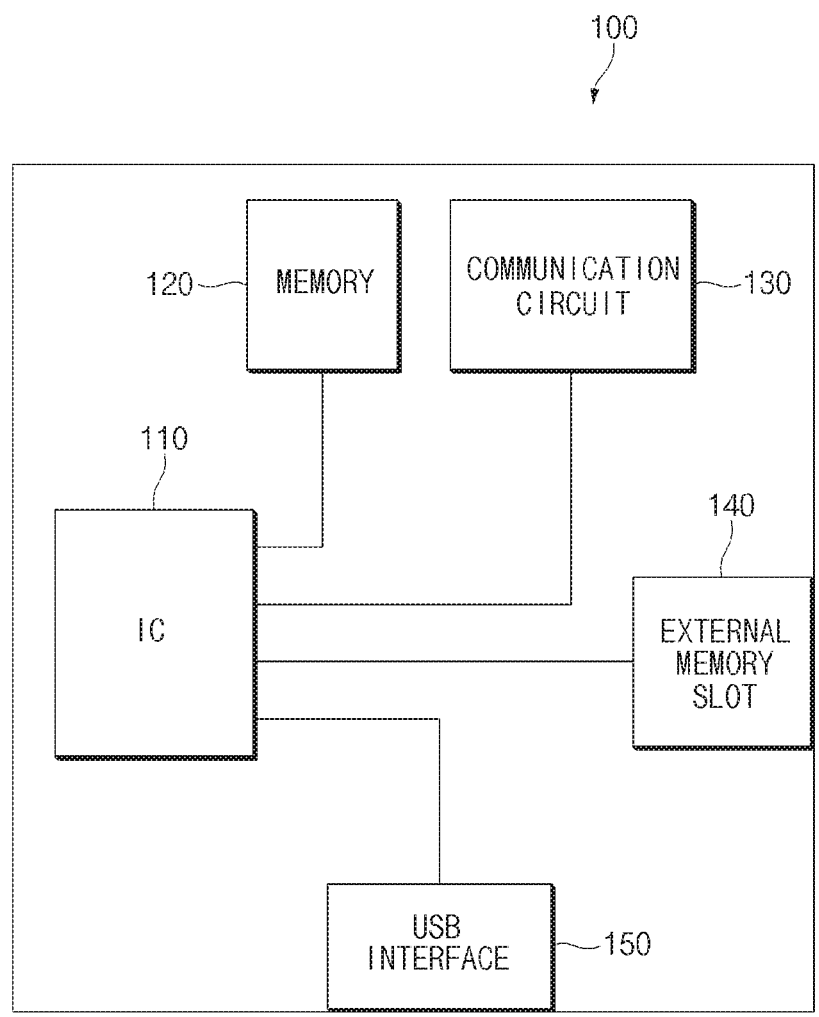
FIG. 1 is a block diagram of an electronic device according to an embodiment.

FIG. 1 is a block diagram of an electronic device according to an embodiment.

Referring to FIG. 1, an electronic device 100 according to an embodiment may include an integrated circuit (IC) 110 and a plurality of hardware modules 120 to 150 (e.g., a memory 120, a communication circuit 130, an external memory slot 140, an USB interface 150, and the like). According to an embodiment, the electronic device 100 may further include a hardware module not illustrated in FIG. 1. According to an embodiment, the electronic device 100 may not include a part (e.g., the external memory slot 140) of the hardware modules 120 to 150 (e.g., the memory 120, the communication circuit 130, the external memory slot 140, and the USB interface 150) illustrated in FIG. 1.

The integrated circuit 110 may be an application processor that controls the plurality of hardware modules 120 to 150. A configuration and an operation of the integrated circuit 110 will be described in detail below.

The plurality of hardware modules 120 to 150 may be controlled by the integrated circuit 110. According to an embodiment, the plurality of hardware modules 120 to 150 may be hardware modules associated with an input/output of data. For example, the plurality of hardware modules 120 to 150 may include the memory 120, the communication circuit 130, the external memory slot 140, the USB interface 150, and the like.

The memory 120 may include a volatile and/or nonvolatile memory. The memory 120 may store an instruction or data associated with a component of the electronic device 100. The memory 120 may store software and/or a program.

The communication circuit 130 may include various modules for the purpose of supporting communication using various networks. For example, the communication circuit 130 may include a cellular module for supporting cellular communication such as 2G/3G, LTE, LTE-A (LTE-Advanced), CDMA (Code Division Multiple Access), WCDMA (Wideband CDMA), UMTS (Universal Mobile Telecommunications System), and WiBro (Wireless Broadband). Also, the communication circuit 130 may include a Wi-Fi module for supporting an Internet access through an access point (AP) such as Wi-Fi. Also, the communication circuit 130 may include a Bluetooth module for device-to-device communication.

The external memory slot 140 may be a slot into which an external memory is capable of being inserted. According to an embodiment, the external memory slot 140 may accommodate an SD card or a micro SD card. According to an embodiment, through the external memory slot 140, the integrated circuit 110 may fetch data stored in the external memory or may store data stored in the electronic device 100 in the external memory.

The USB interface 150 may be an interface 150 for USB communication with an external device. According to an embodiment, the USB interface 150 may be a connector of the electronic device 100. According to an embodiment, the integrated circuit 110 may be connected with an external electronic device through the USB interface 150 and may exchange data with the external electronic device through the USB interface 150.

According to various embodiments, the electronic device 100 may further include any other hardware module in addition to the components illustrated in FIG. 1 or may not include a part of the components illustrated in FIG. 1.

Figure 2:
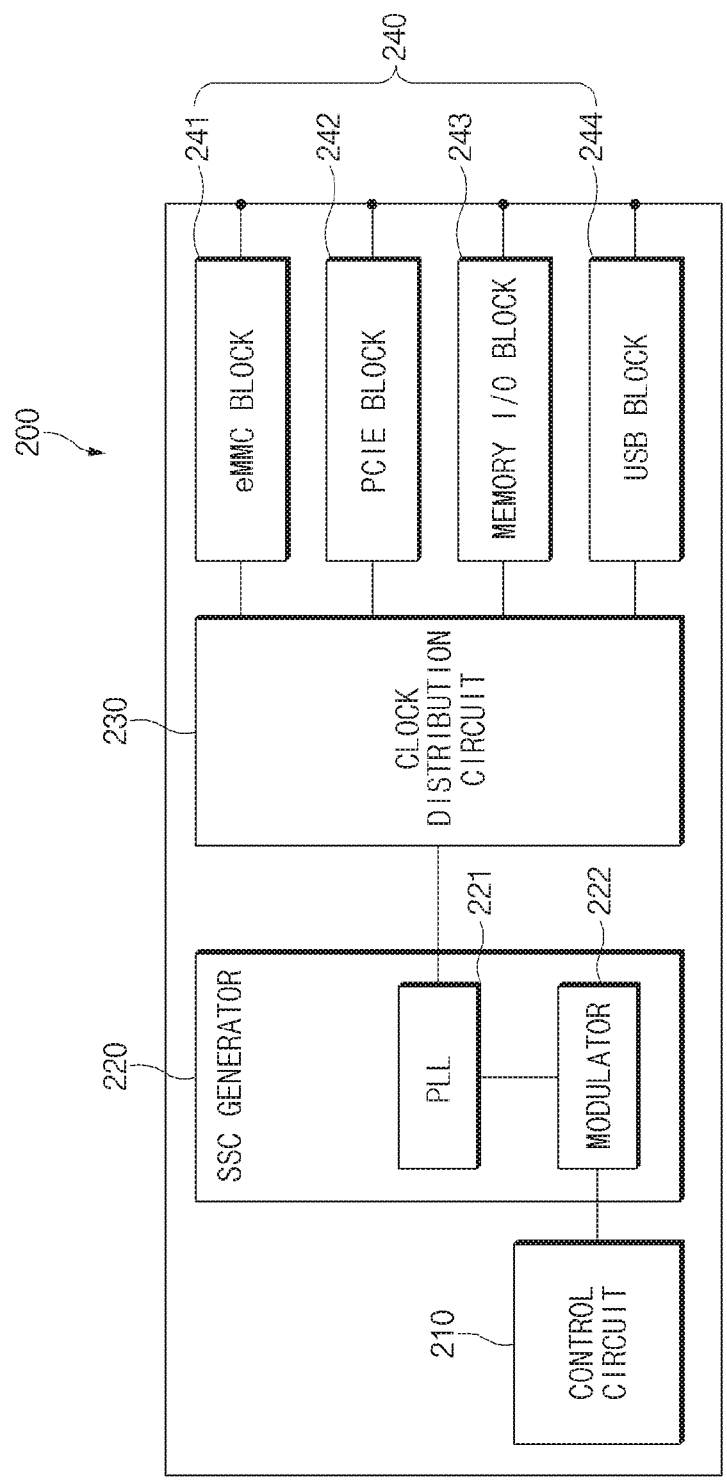
FIG. 2 is a block diagram of an integrated circuit according to an embodiment.

FIG. 2 is a block diagram of an integrated circuit according to an embodiment.

Referring to FIG. 2, an integrated circuit 200 according to an embodiment may include a control circuit 210, a spread spectrum clock (SSC) generator 220, a clock distribution circuit 230, and a plurality of function blocks 240. According to an embodiment, the integrated circuit 200 may further include a hardware module not illustrated in FIG. 2. According to an embodiment, the integrated circuit 200 may not include a part (e.g., a memory I/O block 243) of the function blocks 240 (e.g., an eMMC block 241, a PCIE block 242, the memory I/O block 243, and a USB block 244) illustrated in FIG. 2.

The control circuit 210 may determine a frequency modulation rate of a spread spectrum clock SSC that the SSC generator 220 outputs based on operation states of the plurality of function blocks 240. According to an embodiment, the control circuit 210 may monitor the operation states of the plurality of function blocks 240. An operation of the control circuit 210 will be described in detail below.

According to an embodiment, the control circuit 210 may include a memory. The memory of the control circuit 210 according to an embodiment may include predetermined frequency modulation rate values respectively corresponding to the plurality of function blocks 240. According to an embodiment, the memory of the control circuit 210 may not be included in the control circuit 210 and may be included in the integrated circuit 200 independently of the control circuit 210.

According to an embodiment, the memory of the control circuit 210 may store about 0.5% being a frequency modulation rate value corresponding to the eMMC block 241, about 0.1% being a frequency modulation rate value corresponding to the PCIE block 242, about 2% being a frequency modulation rate value corresponding to the memory I/O block 243, and about 0.2% being a frequency modulation rate value corresponding to the USB block 244.

The SSC generator 220 may generate a clock having a spectrum that is spread by intentionally applying a random jitter to an existing clock signal for the purpose of reducing a maximum electromagnetic interference (EMI) generated by a clock signal.

According to an embodiment, the SSC generator 220 may include a phase locked loop (PLL) 221 and a modulator 222.

The PLL 221 may generate a clock and may output the generated clock to the clock distribution circuit 230. The modulator 222 may modulate a frequency of the clock that the PLL 221 generates. According to an embodiment, a frequency modulation rate of the modulator 222 may be determined by the control circuit 210.

According to an embodiment, the SSC generator 220 may generate a spread spectrum clock in a center spreading manner.

According to an embodiment, the clock distribution circuit 230 may include one or more dividers, one or more multiplexers, and a plurality of clock gates.

The divider(s) may divide an input clock frequency by an integer and may output a clock of the divided frequency. The multiplexer(s) may select one of a plurality of inputs and may provide a single output. The clock gates may be respectively connected with the plurality of function blocks 240 and may determine whether to apply a clock.

The plurality of function blocks 240 may provide functions by using the clock supplied from the clock distribution circuit 230. According to an embodiment, the function blocks 240 may be respectively connected with the hardware modules 120 to 150 of FIG. 1 and may perform operations associated with the connected hardware modules 120 to 150.

According to an embodiment, the eMMC block 241 may be connected with the memory 120 of the electronic device 100 of FIG. 1 and may perform an operation associated with a data input/output of the memory 120. The PCIE block 242 may be connected with the communication circuit 130 of the electronic device 100 and may perform an operation associated with data communication. The memory I/O block 243 may be connected with the external memory slot 140 and may perform an operation associated with a data input/output with an external memory. The USB block 244 may be connected with the USB interface 150 and may perform an operation associated with a data input/output with an external device.

Figure 3:
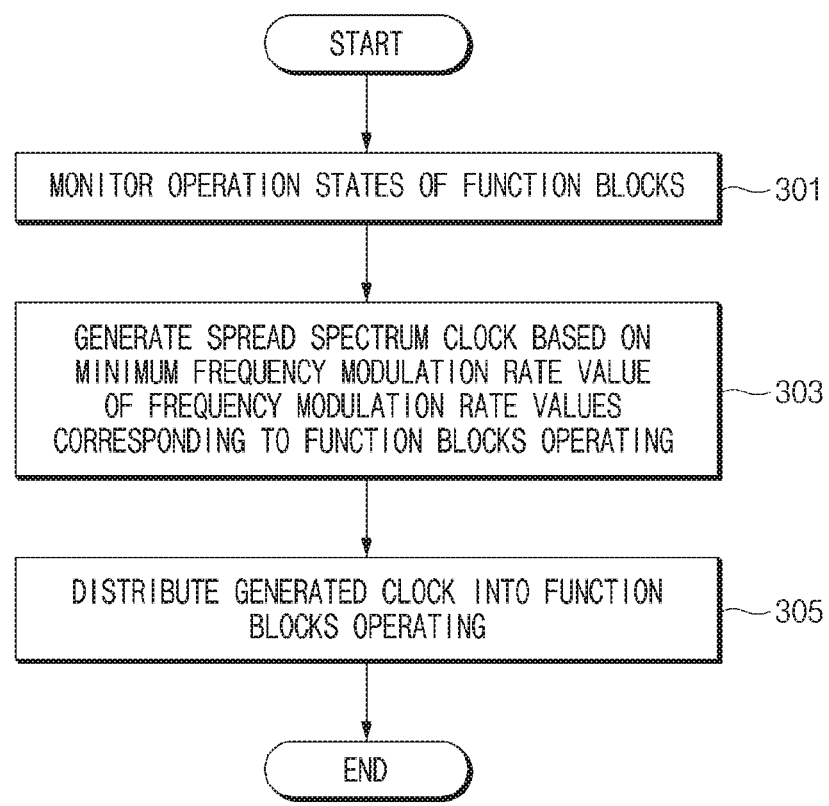
FIG. 3 is a flowchart illustrating a method for reducing an EMI of an integrated circuit according to an embodiment.

FIG. 3 is a flowchart illustrating a method for reducing an EMI of an integrated circuit according to an embodiment.

Below, it is assumed that the integrated circuit 200 of FIG. 2 performs a process of FIG. 3. An operation that is described as being performed by the integrated circuit 200 may be implemented by instructions capable of being performed (or executed) by the control circuit 210 of the integrated circuit 200. The instructions may be stored in a memory of the integrated circuit 200 illustrated in FIG. 2.

In operation 301, the control circuit 210 may monitor operation states of the plurality of function blocks 240 included in the integrated circuit 200.

According to an embodiment, the control circuit 210 may determine the operation states of the plurality of function blocks 240 based on input/output signals associated with the plurality of function blocks 240.

According to an embodiment, the control circuit 210 may determine the operation states of the plurality of function blocks 240 based on at least one of a clock enable signal or a clock gating signal included in an output of the plurality of function blocks 240.

According to an embodiment, the control circuit 210 may determine an operation state based on a sleep state signal or an active state signal of at least one of a finite state machine or a power management block, which is input to the blocks 240.

In operation 303, under control of the control circuit 210, the SSC generator 220 may generate a spread spectrum clock based on a minimum frequency modulation rate value of frequency modulation rate values respectively corresponding to two or more blocks 240, which are operating, from among the plurality of function blocks 240.

According to an embodiment, the SSC generator 220 may generate the spread spectrum clock based on a smaller frequency modulation rate value among a first frequency modulation rate value and a second frequency modulation rate value respectively corresponding to a first function block and a second function block, which are operating, from among the plurality of function blocks 240.

In an embodiment, it is assumed that the memory of the control circuit 210 stores about 0.5% being a frequency modulation rate value corresponding to the eMMC block 241, about 0.1% being a frequency modulation rate value corresponding to the PCIE block 242, about 2% being a frequency modulation rate value corresponding to the memory I/O block 243, and about 0.2% being a frequency modulation rate value corresponding to the USB block 244.

In operation 301 according to an embodiment, the control circuit 210 may monitor the plurality of function blocks 240 and may determine that the eMMC block 241 and the USB block 244 operate. According to an embodiment, the control circuit 210 may determine about 0.2% being a smaller value among about 0.5% being the frequency modulation rate value corresponding to the eMMC block 241 and about 0.2% being the frequency modulation rate value corresponding to the USB block 244 as the frequency modulation rate value of the SSC generator 220. According to an embodiment, the control circuit 210 may control the SSC generator 220 so as to generate the spread spectrum clock at the frequency modulation rate of about 0.2%.

In operation 301 according to an embodiment, the control circuit 210 may monitor the plurality of function blocks 240 and may determine that the eMMC block 241 and the memory I/O block 243 operate. According to an embodiment, the control circuit 210 may determine about 0.5% being a smaller value among about 0.5% being the frequency modulation rate value corresponding to the eMMC block 241 and about 2% being the frequency modulation rate value corresponding to the memory I/O block 243 as the frequency modulation rate value of the SSC generator 220. According to an embodiment, the control circuit 210 may control the SSC generator 220 so as to generate the spread spectrum clock at the frequency modulation rate of about 0.5%.

As described in the embodiment, the control circuit 210 may dynamically change the frequency modulation rate of the SSC generator 220 based on operation states of the function blocks 240.

According to an embodiment, the SSC generator 220 may generate the spread spectrum clock in the center spreading manner.

In operation 305, the clock distribution circuit 230 may distribute the spread spectrum clock, which the SSC generator 220 generates, into the plurality of function blocks 240 operating.

According to an embodiment, the function blocks 240 supplied with the clock may provide functions by using the clock supplied from the clock distribution circuit 230.

Figure 4:
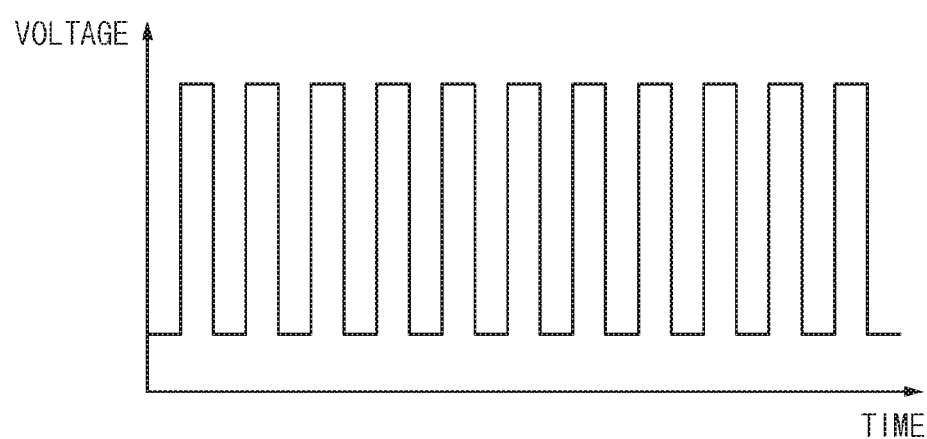
FIG. 4 is a diagram illustrating a waveform of a clock signal to which a spread spectrum according to an embodiment is not applied.
Figure 5:
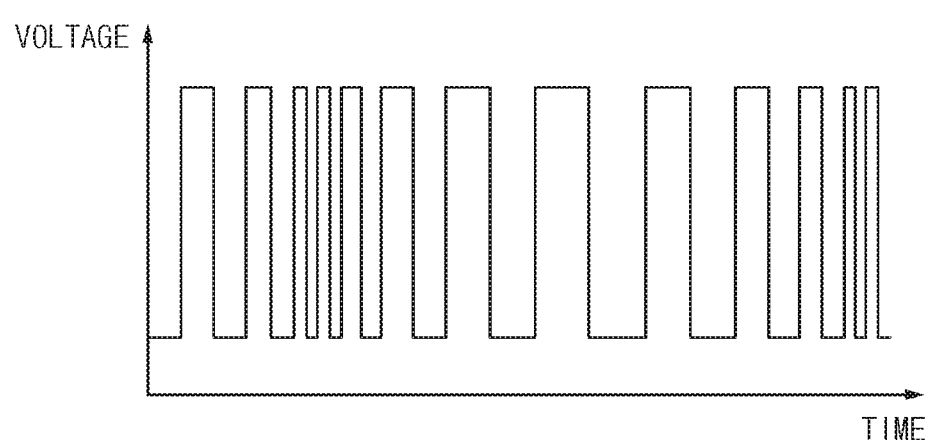
FIG. 5 is a diagram illustrating a waveform of a clock signal to which a spread spectrum according to an embodiment is applied.

FIG. 4 is a diagram illustrating a waveform of a clock signal to which a spread spectrum according to an embodiment is not applied. FIG. 5 is a diagram illustrating a waveform of a clock signal to which a spread spectrum according to an embodiment is applied.

According to an embodiment, a clock generator may generate a clock of a uniform frequency as illustrated in FIG. 4. According to an embodiment, in the case where the clock generator generates the clock as illustrated in FIG. 4, a power level according to a frequency of a clock signal may be distributed as illustrated in FIG. 5. Referring to FIG. 5, a power may peak at a center frequency f0 of the clock that the clock generator generates. Under this condition, in the case of supplying the clock illustrated in FIG. 4 to the function blocks 240, an electromagnetic interference (EMI) may occur.

Figure 6:
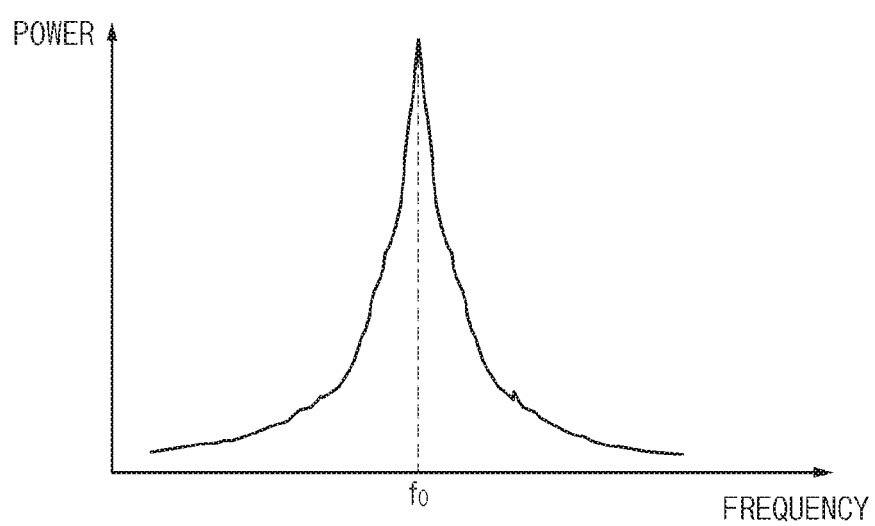
FIG. 6 is a diagram illustrating a waveform of a spread spectrum clock signal according to an embodiment.
Figure 7:
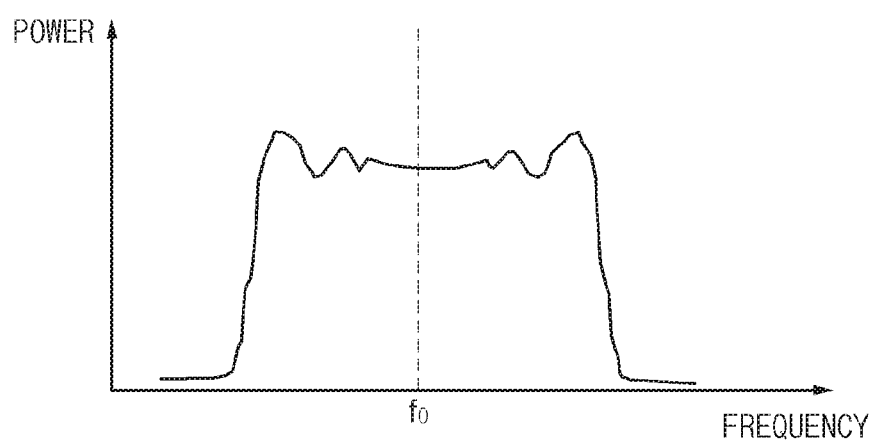
FIG. 7 is a diagram illustrating a power level of a spread spectrum clock signal according to an embodiment.

FIG. 6 is a diagram illustrating a waveform of a spread spectrum clock signal according to an embodiment. FIG. 7 is a diagram illustrating a power level of a spread spectrum clock signal according to an embodiment.

According to an embodiment, the SSC generator 220 may generate a clock of a frequency that varies as illustrated in FIG. 6. In other words, the SSC generator 220 may generate a clock having a spectrum that is spread by applying a jitter to the clock signal illustrated in FIG. 4.

According to an embodiment, in the case where the SSC generator 220 generates the clock as illustrated in FIG. 6, a power level according to a frequency of a clock signal may be distributed as illustrated in FIG. 7. According to an embodiment, the clock according to FIGS. 6 and 7 may be a clock that the SSC generator 220 generates by using the center spreading manner.

In FIG. 5, a power may peak at the center frequency $f_0$ of the clock that the SSC generator 220 generates; in contrast, in FIG. 7, a power level at the center frequency $f_0$ decreases. In the case where a power peak decreases as described above, it may be possible to prevent the EMI from occurring.

Figure 8:
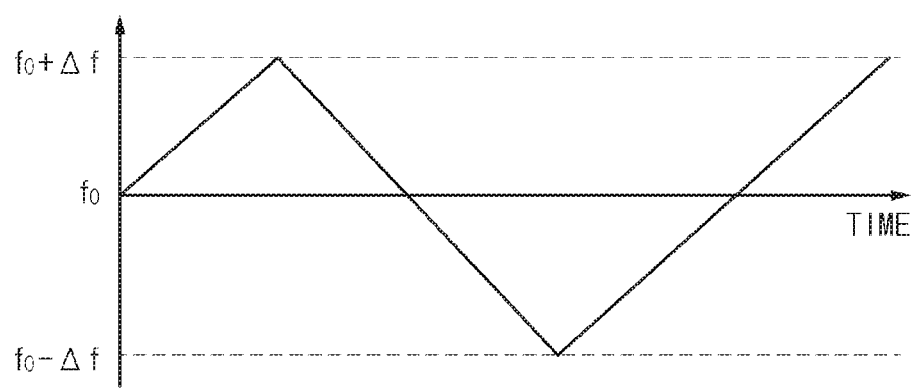
FIG. 8 is a diagram illustrating an example of a modulation frequency and a frequency modulation rate of a spread spectrum according to an embodiment.

FIG. 8 is a diagram illustrating an example of a modulation frequency and a frequency modulation rate of a spread spectrum according to an embodiment.

A manner of generating a spread spectrum clock includes a down spreading manner, a center spreading, an up spreading manner, or the like.

According to an embodiment, the SSC generator 220 of the disclosure may generate the spread spectrum clock in the center spreading manner. According to an embodiment, the SSC generator 220 may change a clock frequency over time, as illustrated in FIG. 8.

In FIG. 8, $f_0$ is a center frequency that the SSC generator 220 generates, and $\Delta f$ is the variations in a frequency according to a modulation rate. In an embodiment, in the case where $f_0$ is 50 kHz and a modulation rate is about 1%, $\Delta f$ is 0.5 KHz.

According to an embodiment, in the case where $f_0$ is 50 kHz and a modulation rate is about 1%, over time, a frequency of a clock that the SSC generator 220 generates may increase from 50 kHz to 50.5 kHz and may then decrease from 50.5 kHz to 49.5 kHz. Afterwards, the frequency of the clock may increase from 49.5 kHz to 50.5 kHz.

According to an embodiment, the SSC generator 220 may generate the spread spectrum clock in the center spreading manner being a manner of varying a frequency of a clock like a graph of FIG. 8.

Figure 9:
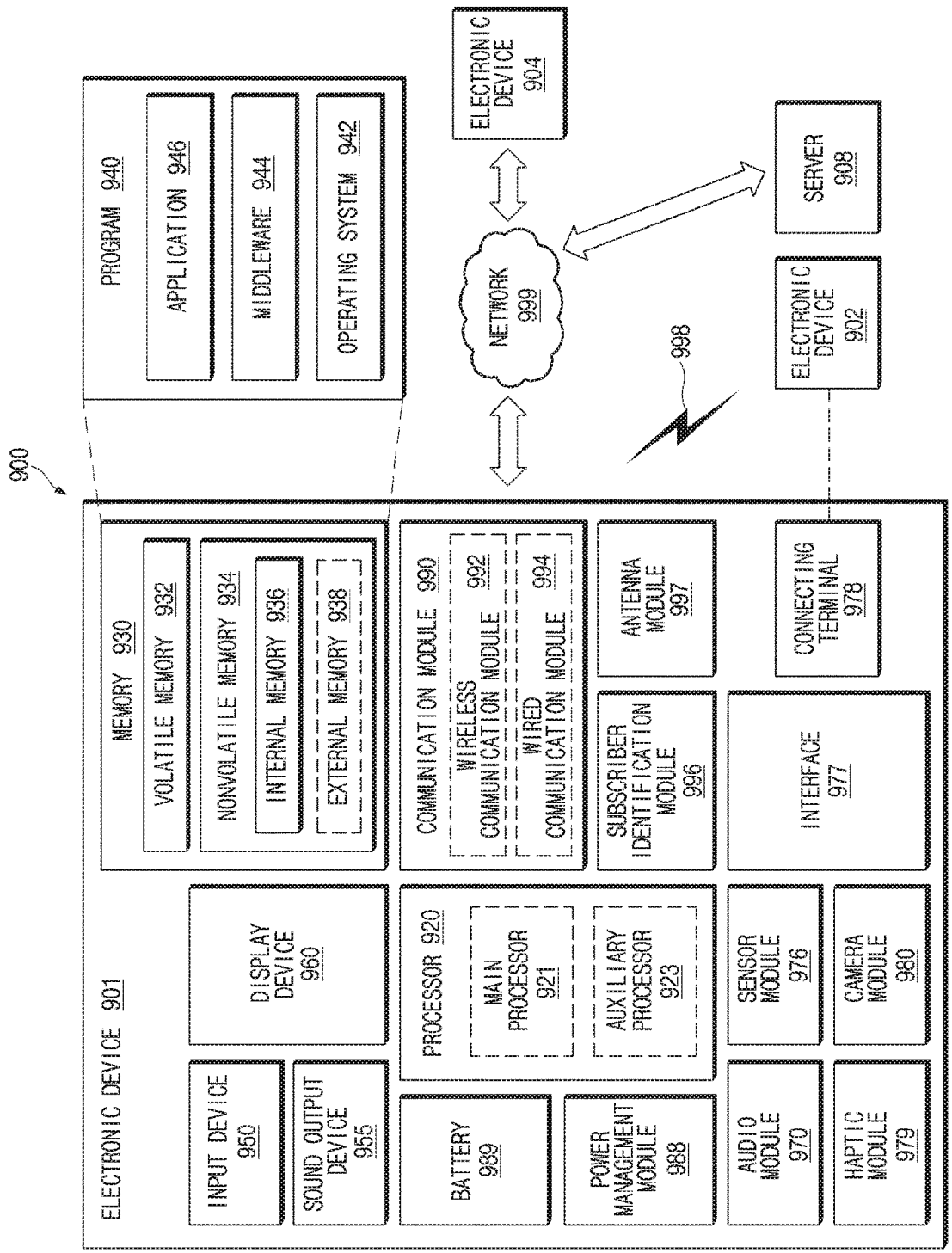
FIG. 9 is a block diagram illustrating an electronic device in a network environment according to various embodiments.

FIG. 9 is a block diagram illustrating an electronic device 901 in a network environment 900 according to various embodiments. Referring to FIG. 9, the electronic device 901 in the network environment 900 may communicate with an electronic device 902 via a first network 998 (e.g., a short-range wireless communication network), or an electronic device 904 or a server 908 via a second network 999 (e.g., a long-range wireless communication network). According to an embodiment, the electronic device 901 may communicate with the electronic device 904 via the server 908. According to an embodiment, the electronic device 901 may include a processor 920, memory 930, an input device 950, a sound output device 955, a display device 960, an audio module 970, a sensor module 976, an interface 977, a haptic module 979, a camera module 980, a power management module 988, a battery 989, a communication module 990, a subscriber identification module (SIM) 996, or an antenna module 997. In some embodiments, at least one (e.g., the display device 960 or the camera module 980) of the components may be omitted from the electronic device 901, or one or more other components may be added in the electronic device 901. In some embodiments, some of the components may be implemented as single integrated circuitry. For example, the sensor module 976 (e.g., a fingerprint sensor, an iris sensor, or an illuminance sensor) may be implemented as embedded in the display device 960 (e.g., a display).

The processor 920 (e.g., IC 110) may execute, for example, software (e.g., a program 940) to control at least one other component (e.g., a hardware or software component) of the electronic device 901 coupled with the processor 920, and may perform various data processing or computation. According to one embodiment, as at least part of the data processing or computation, the processor 920 may load a command or data received from another component (e.g., the sensor module 976 or the communication module 990) in volatile memory 932, process the command or the data stored in the volatile memory 932, and store resulting data in non-volatile memory 934. According to an embodiment, the processor 920 may include a main processor 921 (e.g., a central processing unit (CPU) or an application processor (AP)), and an auxiliary processor 923 (e.g., a graphics processing unit (GPU), an image signal processor (ISP), a sensor hub processor, or a communication processor (CP)) that is operable independently from, or in conjunction with, the main processor 921. Additionally or alternatively, the auxiliary processor 923 may be adapted to consume less power than the main processor 921, or to be specific to a specified function. The auxiliary processor 923 may be implemented as separate from, or as part of the main processor 921.

The auxiliary processor 923 may control at least some of functions or states related to at least one component (e.g., the display device 960, the sensor module 976, or the communication module 990) among the components of the electronic device 901, instead of the main processor 921 while the main processor 921 is in an inactive (e.g., sleep) state, or together with the main processor 921 while the main processor 921 is in an active state (e.g., executing an application). According to an embodiment, the auxiliary processor 923 (e.g., an image signal processor or a communication processor) may be implemented as part of another component (e.g., the camera module 980 or the communication module 990) functionally related to the auxiliary processor 923.

The memory 930 may store various data used by at least one component (e.g., the processor 920 or the sensor module 976) of the electronic device 901. The various data may include, for example, software (e.g., the program 940) and input data or output data for a command related therereto. The memory 930 may include the volatile memory 932 or the non-volatile memory 934.

The program 940 may be stored in the memory 930 as software, and may include, for example, an operating system (OS) 942, middleware 944, or an application 946.

The input device 950 may receive a command or data to be used by other component (e.g., the processor 920) of the electronic device 901, from the outside (e.g., a user) of the electronic device 901. The input device 950 may include, for example, a microphone, a mouse, or a keyboard.

The sound output device 955 may output sound signals to the outside of the electronic device 901. The sound output device 955 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 960 may visually provide information to the outside (e.g., a user) of the electronic device 901. The display device 960 may include, for example, a display, a hologram device, or a projector and control circuitry to control a corresponding one of the display, hologram device, and projector. According to an embodiment, the display device 960 may include touch circuitry adapted to detect a touch, or sensor circuitry (e.g., a pressure sensor) adapted to measure the intensity of force incurred by the touch.

The audio module 970 may convert a sound into an electrical signal and vice versa. According to an embodiment, the audio module 970 may obtain the sound via the input device 950, or output the sound via the sound output device 955 or a headphone of an external electronic device (e.g., an electronic device 902) directly (e.g., wiredly) or wirelessly coupled with the electronic device 901.

The sensor module 976 may detect an operational state (e.g., power or temperature) of the electronic device 901 or an environmental state (e.g., a state of a user) external to the electronic device 901, and then generate an electrical signal or data value corresponding to the detected state. According to an embodiment, the sensor module 976 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 977 may support one or more specified protocols to be used for the electronic device 901 to be coupled with the external electronic device (e.g., the electronic device 902) directly (e.g., wiredly) or wirelessly. According to an embodiment, the interface 977 may include, for example, a high definition multimedia interface (HDMI), a universal serial bus (USB) interface, a secure digital (SD) card interface, or an audio interface.

A connecting terminal 978 may include a connector via which the electronic device 901 may be physically connected with the external electronic device (e.g., the electronic device 902). According to an embodiment, the connecting terminal 978 may include, for example, a HDMI connector, a USB connector, a SD card connector, or an audio connector (e.g., a headphone connector), The haptic module 979 may convert an electrical signal into a mechanical stimulus (e.g., a vibration or a movement) or electrical stimulus which may be recognized by a user via his tactile sensation or kinesthetic sensation. According to an embodiment, the haptic module 979 may include, for example, a motor, a piezoelectric element, or an electric stimulator.

The camera module 980 may capture a still image or moving images. According to an embodiment, the camera module 980 may include one or more lenses, image sensors, image signal processors, or flashes.

The power management module 988 may manage power supplied to the electronic device 901. According to one embodiment, the power management module 988 may be implemented as at least part of, for example, a power management integrated circuit (PMIC).

The battery 989 may supply power to at least one component of the electronic device 901. According to an embodiment, the battery 989 may include, for example, a primary cell which is not rechargeable, a secondary cell which is rechargeable, or a fuel cell.

The communication module 990 (e.g., the communication circuit 130) may support establishing a direct (e.g., wired) communication channel or a wireless communication channel between the electronic device 901 and the external electronic device (e.g., the electronic device 902, the electronic device 904, or the server 908) and performing communication via the established communication channel. The communication module 990 may include one or more communication processors that are operable independently from the processor 920 (e.g., the application processor (AP)) and supports a direct (e.g., wired) communication or a wireless communication. According to an embodiment, the communication module 990 may include a wireless communication module 992 (e.g., a cellular communication module, a short-range wireless communication module, or a global navigation satellite system (GNSS) communication module) or a wired communication module 994 (e.g., a local area network (LAN) communication module or a power line communication (PLC) module). A corresponding one of these communication modules may communicate with the external electronic device via the first network 998 (e.g., a short-range communication network, such as Bluetooth™, wireless-fidelity (Wi-Fi) direct, or infrared data association (IrDA)) or the second network 999 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 992 may identify and authenticate the electronic device 901 in a communication network, such as the first network 998 or the second network 999, using subscriber information (e.g., international mobile subscriber identity (IMSI)) stored in the subscriber identification module 996.

The antenna module 997 may transmit or receive a signal or power to or from the outside (e.g., the external electronic device) of the electronic device 901. According to an embodiment, the antenna module 997 may include one or more antennas, and, therefrom, at least one antenna appropriate for a communication scheme used in the communication network, such as the first network 998 or the second network 999, may be selected, for example, by the communication module 990 (e.g., the wireless communication module 992). The signal or the power may then be transmitted or received between the communication module 990 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 901 and the external electronic device 904 via the server 908 coupled with the second network 999. Each of the electronic devices 902 and 904 may be a device of a same type as, or a different type, from the electronic device 901. According to an embodiment, all or some of operations to be executed at the electronic device 901 may be executed at one or more of the external electronic devices 902, 904, or 908. For example, if the electronic device 901 should perform a function or a service automatically, or in response to a request from a user or another device, the electronic device 901, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 901. The electronic device 901 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 940) including one or more instructions that are stored in a storage medium (e.g., internal memory 936 or external memory 938) that is readable by a machine (e.g., the electronic device 901). For example, a processor (e.g., the processor 920) of the machine (e.g., the electronic device 901) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

An integrated circuit (e.g., the integrated circuit 200) according to an embodiment of the disclosure a plurality of function blocks, a spread spectrum clock (SSC) generator (e.g., the SSC generator 220) that generates a spread spectrum clock based on a frequency modulation rate value, a clock distribution circuit (e.g., the clock distribution circuit 230) that distributes the generated spread spectrum clock into the plurality of function blocks, a memory that stores predetermined frequency modulation rate values respectively corresponding to the plurality of function blocks, and a control circuit (e.g., the control circuit 210), and the control circuit may be configured to generate the spread spectrum clock based at least on a smaller frequency modulation rate value among a first frequency modulation rate value and a second frequency modulation rate value respectively corresponding to a first function block and a second function block, which are operating, from among the plurality of function blocks.

In an embodiment, the SSC generator may include a phase locked loop (PLL) (e.g., the PLL 221) generating a clock and a modulator (e.g., the modulator 222) modulating a frequency of the clock that the PLL generates.

In an embodiment, the SSC generator may generate the spread spectrum clock in a center spreading manner.

In an embodiment, the plurality of function blocks may perform a function associated with an input/output of data.

In an embodiment, a block performing the function associated with the input/output of the data may include at least one of an embedded multimedia card (eMMC) block (e.g., the eMMC block 241), a PCIE block (e.g., the PCIE block 242), an external memory input/output block (e.g., the external memory input/output block 243), or a USB block (e.g., the USB block 244).

In an embodiment, at least two frequency modulation rate values of predetermined frequency modulation rate values that are stored in the memory and respectively correspond to the plurality of function blocks may be different from each other.

In an embodiment, the control circuit may be configured to determine whether the plurality of function blocks operate, based on an input/output signal associated with the plurality of function blocks.

In an embodiment, the control circuit may be configured to determine whether the plurality of function blocks operate, based on a clock enable signal included in an output of the plurality of function blocks.

In an embodiment, the control circuit may be configured to determine whether the plurality of function blocks operate, based on a clock gating signal included in an output of the plurality of function blocks.

In an embodiment, the control circuit may be configured to determine whether the plurality of function blocks operate, based on a sleep state signal or an active state signal of at least one of a finite state machine or a power management block, which is input to the plurality of function blocks.

Also, an EMI reducing method of an integrated circuit according to an embodiment of the disclosure may include monitoring operation states of a plurality of function blocks included in the integrated circuit, generating a spread spectrum clock based at least on a smaller frequency modulation rate value among a first frequency modulation rate value and a second frequency modulation rate value respectively corresponding to a first function block and a second function block, which are operating, from among the plurality of function blocks, and distributing the generated spread spectrum clock into the first function block and the second function block operating.

In an embodiment, the generating of the spread spectrum clock may include generating the spread spectrum clock in a center spreading manner.

In an embodiment, the plurality of function blocks may perform a function associated with an input/output of data.

In an embodiment, a block performing the function associated with the input/output of the data may include at least one of an embedded multimedia card (eMMC) block, a PCIE block, an external memory input/output block, or a USB block.

In an embodiment, the monitoring of the operation states of the plurality of function blocks may include monitoring the operation states of the plurality of blocks based on an input/output signal associated with the plurality of function blocks.

Also, an electronic device according to an embodiment of the disclosure may include an AP (e.g., the integrated circuit 110), and a plurality of hardware modules (e.g., the memory 120, the communication circuit 130, the external memory slot 140, and the USB interface 150) that are controlled by the AP. The AP may include a plurality of function blocks (e.g., the eMMC block 241, the PCIE block 242, the external memory I/O block 243, and the USB block 244) that are functionally connected with the plurality of hardware modules, an SSC generator that generates a spread spectrum clock based on a frequency modulation value, a clock distribution circuit that distributes the generated spread spectrum clock to the plurality of function blocks, a memory that stores predetermined frequency modulation values respectively corresponding to the plurality of function blocks, and a control circuit. The control circuit may be configured to control the SSC generator so as to generate the spread spectrum clock, based on a smaller frequency modulation rate value of a first frequency modulation rate value and a second frequency modulation rate value respectively corresponding to a first function block and a second function block, which are operating, from among the plurality of function blocks.

In an embodiment, the SSC generator may include a phase locked loop (PLL) generating a clock and a modulator modulating a frequency of the clock that the PLL generates.

In an embodiment, the SSC generator may generate the spread spectrum clock in a center spreading manner.

In an embodiment, the plurality of function blocks may perform a function associated with an input/output of data.

In an embodiment, the control circuit may be configured to determine whether the plurality of function blocks operate, based on an input/output signal associated with the plurality of function blocks.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An integrated circuit comprising:
a plurality of function blocks;
a spread spectrum clock (SSC) generator configured to generate a spread spectrum clock based on a frequency modulation rate value;
a clock distribution circuit configured to distribute the generated spread spectrum clock into the plurality of function blocks;
a memory configured to store predetermined frequency modulation rate values respectively corresponding to the plurality of function blocks; and
a control circuit configured to control the SSC generator,
wherein the SSC generator is configured to:
generate the spread spectrum clock based on a smaller frequency modulation rate value among a first frequency modulation rate value and a second frequency modulation rate value respectively corresponding to a first function block and a second function block, which are operating, from among the plurality of function blocks.

2. The integrated circuit of claim 1, wherein the SSC generator includes a phase locked loop (PLL) configured to generate a clock and a modulator configured to modulate a frequency of the clock that the PLL generates.

3. The integrated circuit of claim 1, wherein the SSC generator is configured to generate the spread spectrum clock in a center spreading manner.

4. The integrated circuit of claim 1, wherein the plurality of function blocks is configured to perform a function associated with an input/output of data.

5. The integrated circuit of claim 4, wherein a block configured to perform the function associated with the input/output of the data includes at least one of an embedded multimedia card (eMMC) block, a PCIE block, an external memory input/output block, or a USB block.

6. The integrated circuit of claim 1, wherein at least two frequency modulation rate values of the predetermined frequency modulation rate values that are stored in the memory and respectively correspond to the plurality of function blocks are different from each other.

7. The integrated circuit of claim 1, wherein the control circuit is configured to determine whether the plurality of function blocks operate, based on an input/output signal associated with the plurality of function blocks.

8. The integrated circuit of claim 7, wherein the control circuit is configured to determine whether the plurality of function blocks operate, based on a clock enable signal included in an output of the plurality of function blocks.

9. The integrated circuit of claim 7, wherein the control circuit is configured to determine whether the plurality of function blocks operate, based on a clock gating signal included in an output of the plurality of function blocks.

10. The integrated circuit of claim 7, wherein the control circuit is configured to determine whether the plurality of function blocks operate, based on a sleep state signal or an active state signal of at least one of a finite state machine or a power management block, which is input to the plurality of function blocks.

11. An EMI reducing method of an integrated circuit, comprising:
storing predetermined frequency modulation rate values respectively corresponding to a plurality of function blocks included in the integrated circuit; and
monitoring operation states of the plurality of function blocks to determine the operation states of the plurality of function blocks;
determining a smaller frequency modulation rate value among a first frequency modulation rate value and a second frequency modulation rate value respectively corresponding to a first function block and a second function block, which are operating, from among the plurality of function blocks;
generating a spread spectrum clock based at least on the smaller frequency modulation rate value; and
distributing the generated spread spectrum clock into the first function block and the second function block operating.

12. The method of claim 11, wherein the generating of the spread spectrum clock includes:
generating the spread spectrum clock in a center spreading manner.

13. The method of claim 11, wherein the plurality of function blocks perform a function associated with an input/output of data.

14. The method of claim 13, wherein a block performing the function associated with the input/output of the data includes at least one of an embedded multimedia card (eMMC) block, a PCIE block, an external memory input/output block, or a USB block.

15. The method of claim 11, wherein the monitoring of the operation states of the plurality of function blocks includes:
monitoring the operation states of the plurality of blocks based on an input/output signal associated with the plurality of function blocks.

\* \* \* \* \*